United States Patent
Kawai (10) Patent No.: US 11,291,147 B2
(45) Date of Patent: Mar. 29, 2022

(54) COMPONENT MOUNTING SYSTEM

(71) Applicant: FUJI CORPORATION, Chiryu (JP)

(72) Inventor: Hidetoshi Kawai, Anjo (JP)

(73) Assignee: FUJI CORPORATION, Chiryu (JP)

( * ) Notice: Subject to any disclaimer, the term of this patent is extended or adjusted under 35 U.S.C. 154(b) by 105 days.

(21) Appl. No.: 16/644,788

(22) PCT Filed: Sep. 19, 2017

(86) PCT No.: PCT/JP2017/033702
§ 371 (c)(1),
(2) Date: Mar. 5, 2020

(87) PCT Pub. No.: WO2019/058416
PCT Pub. Date: Mar. 28, 2019

(65) Prior Publication Data
US 2021/0068321 A1    Mar. 4, 2021

(51) Int. Cl.
*H05K 13/02*     (2006.01)
*H05K 13/04*     (2006.01)

(52) U.S. Cl.
CPC ......... *H05K 13/02* (2013.01); *H05K 13/0417* (2013.01)

(58) Field of Classification Search
CPC ............................. H05K 13/02; H05K 13/417
See application file for complete search history.

(56) References Cited

U.S. PATENT DOCUMENTS 5,979,045 A  *  11/1999  Nishimori ............ H05K 13/021
                                                        29/832
6,729,017 B1 *   5/2004  Kashiwagi ......... H05K 13/0411
                                                        29/740
(Continued)

FOREIGN PATENT DOCUMENTS

JP      2008-103418 A       5/2008
JP      2013-051240 A   *   3/2013
(Continued)

OTHER PUBLICATIONS

International Search Report dated Dec. 12, 2017 in PCT/JP2017/033702 filed Sep. 19, 2017, 1 page.

*Primary Examiner* — Carl J Arbes
(74) *Attorney, Agent, or Firm* — Oblon, McClelland, Maier & Neustadt, L.L.P.

(57) ABSTRACT

A component mounting system including multiple component mounting devices to collect components from feeders set at multiple feeder holding sections and mount the components on a board, the multiple feeder holding sections being provided on each of the multiple component mounting devices to removably hold the feeders; and a feeder exchanging device to move along a line along which the multiple component mounting devices are arranged and exchange feeders with respect to each of the component mounting devices. The component mounting system acquires a type and arrangement of each of the feeders set on the multiple component mounting devices, determines whether each of the feeders is set at a predetermined appropriate position, and upon determining that there is a feeder that is not set at the appropriate position, uses the feeder exchanging device to reset the feeder that is not set at the appropriate position.

6 Claims, 12 Drawing Sheets

(56) References Cited

U.S. PATENT DOCUMENTS

| | | | |
|---|---|---|---|
| 10,561,050 B2* | 2/2020 | Iisaka | H05K 13/0857 |
| 2003/0053300 A1* | 3/2003 | Suhara | H05K 13/0417 |
| | | | 361/760 |
| 2017/0172021 A1* | 6/2017 | Mizuno | H05K 13/0417 |
| 2017/0245407 A1* | 8/2017 | Takanami | B65H 75/40 |
| 2017/0322548 A1* | 11/2017 | Ohashi | H05K 13/02 |
| 2018/0046736 A1* | 2/2018 | Sugimoto | G06F 30/20 |
| 2021/0092885 A1* | 3/2021 | Kawai | H05K 13/021 |
| 2021/0144891 A1* | 5/2021 | San | H05K 13/021 |
| 2021/0195817 A1* | 6/2021 | Kuroda | H05K 13/0857 |

FOREIGN PATENT DOCUMENTS

| | | |
|---|---|---|
| JP | 2013-51240 A | 3/2013 |
| WO | WO 2017/085782 A1 | 5/2017 |

* cited by examiner

COMPONENT MOUNTING SYSTEM

TECHNICAL FIELD

This specification discloses a component mounting system provided with a component mounting device and a feeder exchanging device.

BACKGROUND ART

Conventionally, a component mounting device for guiding rearrangement of feeders has been proposed (see patent literature 1). In this component mounting device, operators are prompted to rearrange feeders by guidance displayed on a display device that displays in an order based on a largest difference of movement times or movement distances of a component collecting head between a current feeder order and a feeder order after rearrangement.

CITATION LIST

Patent Literature

Patent Literature 1: JP-A-2013-51240

SUMMARY

Technical Problem

However, the above-described component mounting device merely guides and displays the rearrangement of the feeders on a display device, and the operator must manually set the feeders at designated positions. For this reason, it is also conceivable that the operator sets a feeder in a wrong position.

It is an object of the present disclosure to provide a component mounting system that automatically resets a feeder to an appropriate position when there is a feeder that is not set in an appropriate position.

Solution to Problem

The present disclosure employs the following means to achieve the above object.

Disclosed herein is a component mounting system including: multiple component mounting devices configured to collect components from feeders set at multiple feeder holding sections and mount the components on a board, the multiple feeder holding sections being provided on each of the multiple component mounting devices and configured to removably hold the feeders; and a feeder exchanging device configured to move along a line along which the multiple component mounting devices are arranged and exchange feeders with respect to each of the component mounting devices, wherein the component mounting system is configured to acquire a type and arrangement of each of the feeders set on the multiple component mounting devices, determine whether each of the feeders is set at a predetermined appropriate position, and upon determining that there is a feeder that is not set at the appropriate position, use the feeder exchanging device to reset the feeder that is not set at the appropriate position to the appropriate position for that feeder.

The disclosed component mounting system is configured to acquire a type and arrangement of each of the feeders set on the multiple component mounting devices, determine whether each of the feeders is set at a predetermined appropriate position, and upon determining that there is a feeder that is not set at the appropriate position, use the feeder exchanging device to reset the feeder that is not set at the appropriate position to the appropriate position for that feeder. This allows the component mounting system to automatically reset feeders to the appropriate position even if the operator set a feeder at a wrong position or intentionally set the feeder at any suitable position. As a result, the component mounting system can avoid failure to continuously perform mounting operation and a deterioration of mounting efficiency.

DESCRIPTION OF EMBODIMENTS

Embodiments of the present disclosure are described below with reference to the figures.

Figure 1:
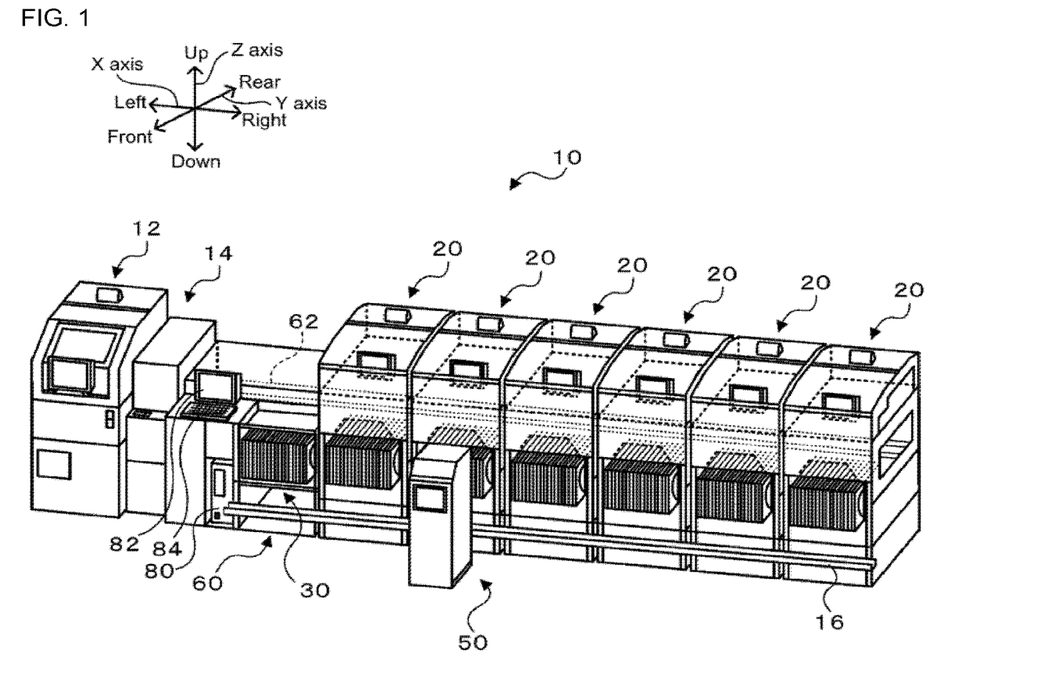
FIG. 1 is a configuration diagram schematically showing the configuration of component mounting system 10 of an embodiment.
Figure 2:
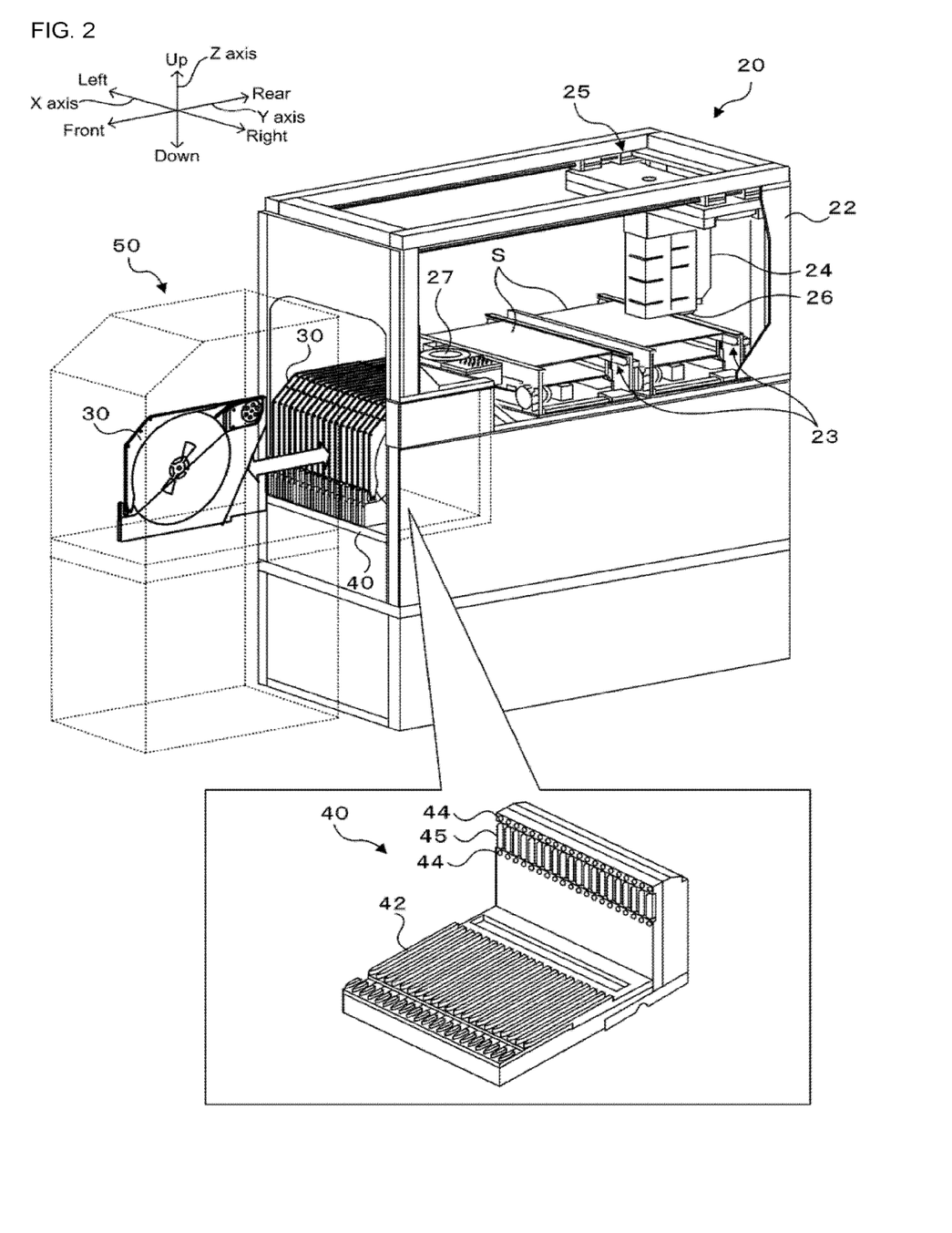
FIG. 2 is a configuration diagram showing an outline of the configuration of component mounting device 20.
Figure 3:
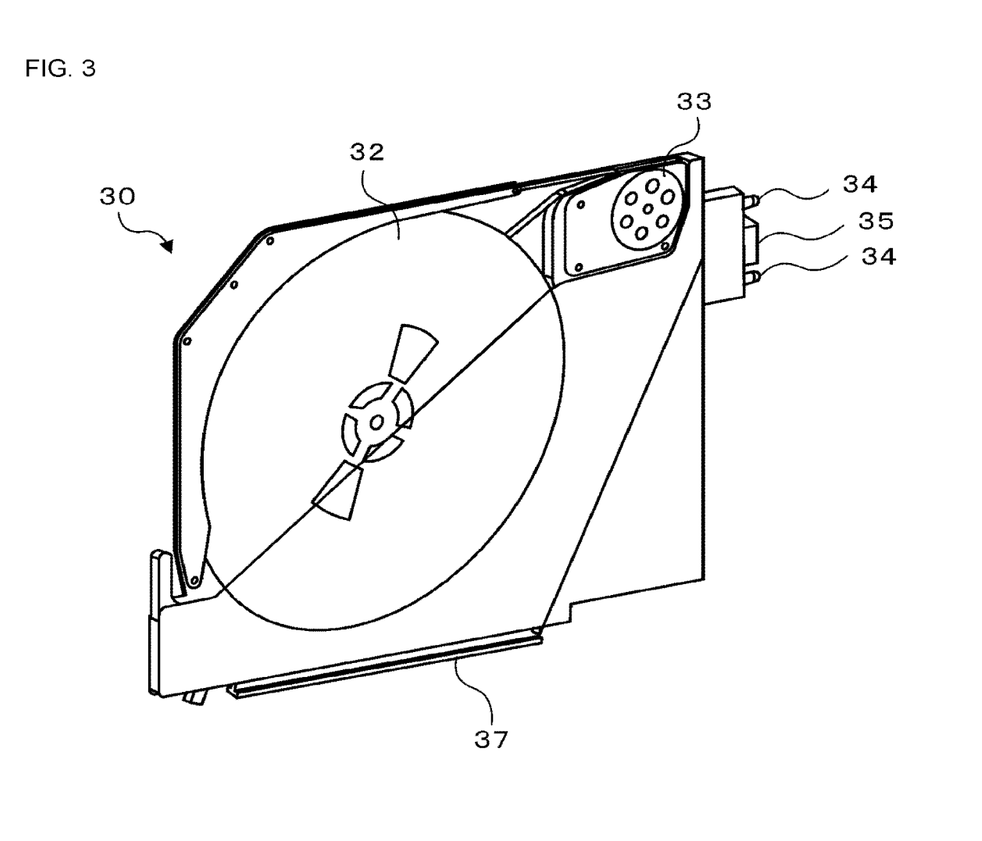
FIG. 3 is a configuration diagram showing an outline of the configuration of feeder 30.
Figure 4:
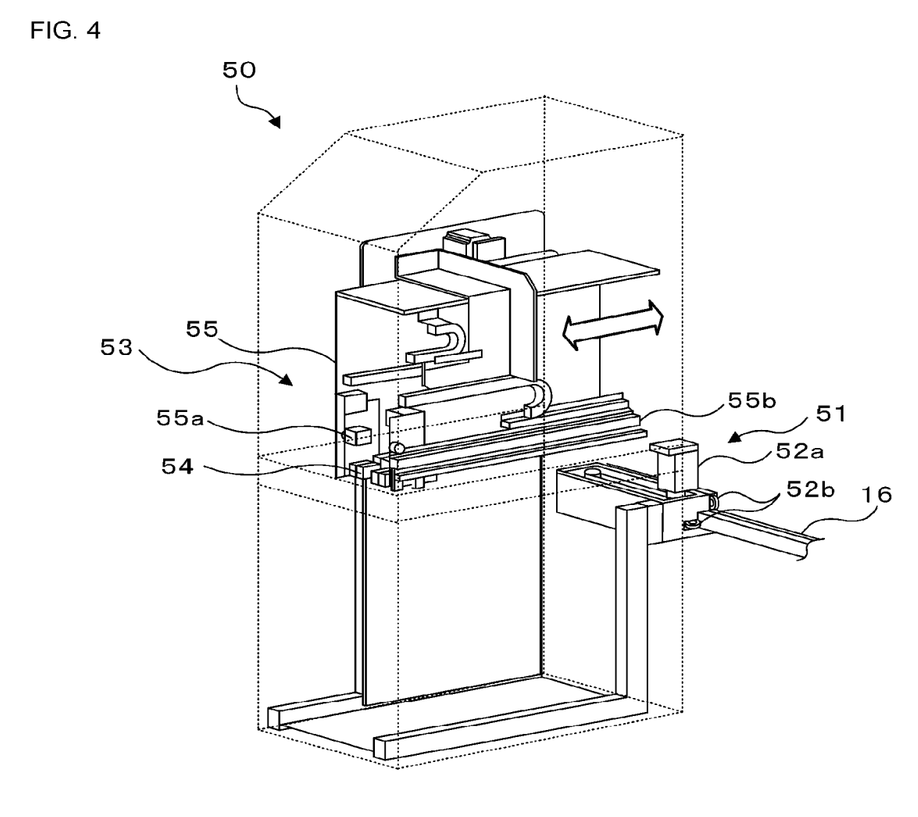
FIG. 4 is a configuration diagram showing an outline of the configuration of feeder exchanging robot 50.
Figure 5:
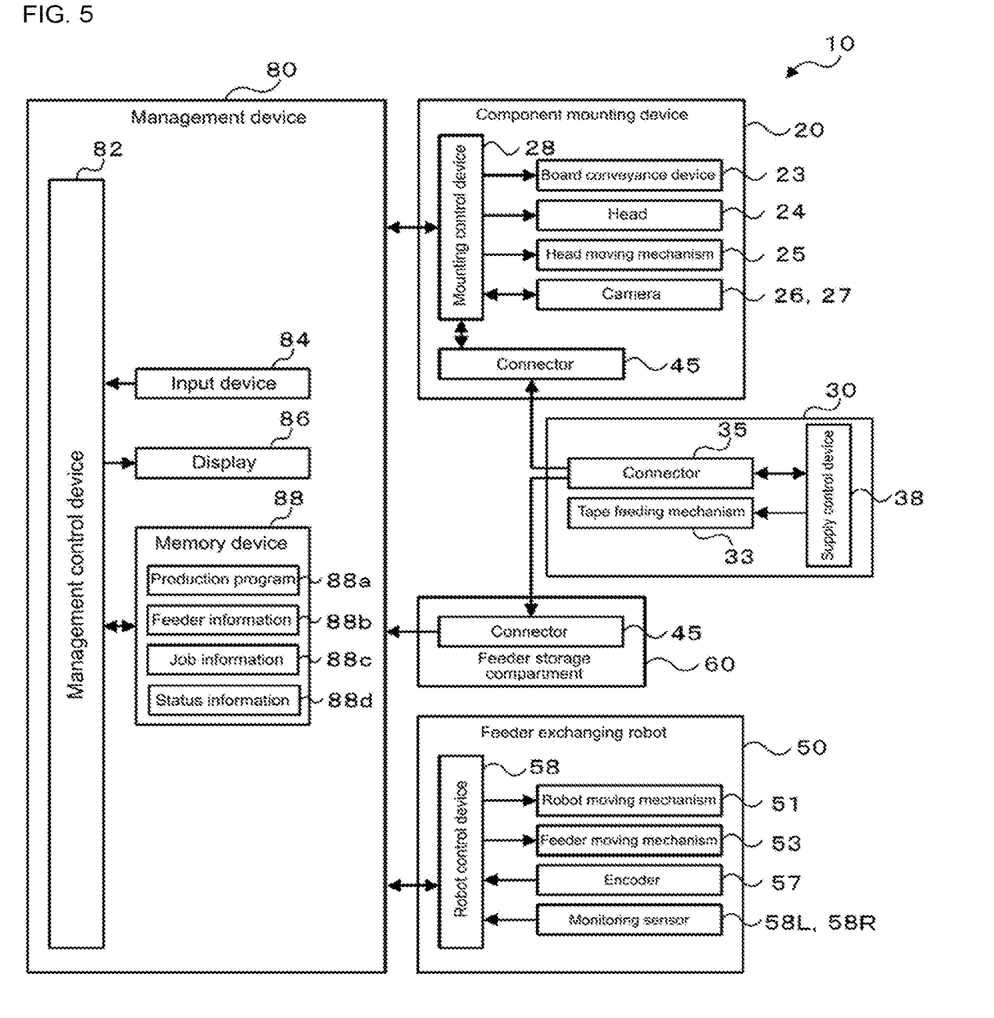
FIG. 5 illustrates electrical connections between component mounting device 10, feeder exchanging robot 50, and management device 80.

FIG. 1 is a configuration diagram schematically showing the configuration of component mounting system 10 of an embodiment. FIG. 2 is a configuration diagram showing an outline of the configuration of component mounting device 20. FIG. 3 is a configuration diagram showing an outline of the configuration of feeder 30. FIG. 4 is a configuration diagram showing an outline of the configuration of feeder exchanging robot 50. FIG. 5 illustrates electrical connections between component mounting device 10, feeder exchanging robot 50, and management device 80. Note that, as shown in FIGS. 1 and 2, the left-right direction is the X-axis direction, the front-rear direction is the Y-axis direction, and the up-down direction is the Z-axis direction.

As shown in FIG. 1, component mounting system 10 includes printing device 12, print inspection device 14, multiple component mounting devices 20, a mounting inspection device (not shown), feeder exchanging robot 50, feeder storage compartment 60, and management device 80 for managing the entire system. Printing device 12 prints solder on board S. Print inspection device 14 inspects the state of the solder printed by printing device 12. Component mounting devices 20 are lined up in the conveyance direction (X-axis direction) of board S, and mount components supplied from feeders 30 to board S. The mounting inspection device checks the mounting condition of the components mounted by component mounting devices 20. Printing device 12, print inspection device 14, component mounting devices 20, and the mounting inspection device are arranged side by side in the conveyance direction of board S in this order to form a production line. Feeder exchanging robot 50 is movable along the production line to supply required feeders 30 to the multiple component mounting devices 20 and to collect used feeders 30 from component mounting devices 20. Feeder storage compartment 60 is incorporated in the production line and stores feeders 30 to be used in component mounting devices 20 and used feeders 30.

As shown in FIG. 2, component mounter 20 is provided with board conveyance device 23 for conveying boards S from left to right, head 24 including a suction nozzle that picks up a component supplied by feeder 30, head moving mechanism 25 that moves head 22 in the left-right directions (XY directions), and mounting control device 28 (refer to FIG. 5) that controls the apparatus overall. Component mounting device 20 also includes mark camera 26, component camera 27, and the like. Mark camera 26 is attached to head 24 and images fiducial marks provided on board S from above. Component camera 27 is installed between feeders 30 and board conveyance device 23, and captures an image of a component from below when the suction nozzle holding the component passes above component camera 27. Mounting control device 28 is composed of a well-known CPU, ROM, RAM, and the like. Image signals from mark camera 26 and component camera 27 are inputted to mounting control device 28. Mounting control device 28 recognizes the position of board S by, for example, processing the image of board S captured by mark camera 26 and recognizing the position of board marks, which are not shown, provided on board S. In addition, mounting control device 28, based on the image captured by component camera 27, determines whether a component is being held by suction nozzle (whether a pickup error has occurred) and determines a pickup position and pickup orientation of the component. Further, mounting control device 28 outputs drive signals to board conveyance device 23, head 24, head moving mechanism 25, and the like.

Feeder 30 is a tape feeder, and as shown in FIG. 3, includes tape reel 32, tape feeding mechanism 33, connector 35, rail member 37, and supply control device 38 (refer to FIG. 5). Tape is wound around tape reel 32. Recesses are formed at predetermined intervals along the length of the tape, and components are accommodated in the respective recesses. The components are protected by a film that covers the surface of the tape. Tape feeding mechanism 33 is for delivering the tape from tape reel 32. Feeder 30 drives tape feeding mechanism 33 to feed the tape to the rear by predetermined amounts, thereby sequentially supplying the components accommodated in the tape to the component supply position. The component accommodated in the tape is exposed at the component supply position by the film being peeled off before the component supply position, and is picked up by the suction nozzle. Connector 35 has two positioning pins 34 protruding in the attachment direction. Rail member 37 is provided at the lower end of feeder 30 and extends in the attachment direction. Supply control device 38 is configured from a CPU, ROM, RAM and the like, and outputs drive signals to tape feeding mechanism 33. Further, supply control device 38 can communicate with a control section (for example, mounting control device 28 or management control device 82) of a set feeder 30 via connector 35.

As shown in FIG. 2, feeder 30 is detachably held on feeder table 40 provided on the front surface of component mounting device 20. Multiple feeder tables 40 are arranged in the X-axis direction, and are attached so that feeders 30 are lined up in the X-axis direction. Feeder table 40 has an L-shaped cross section shape and includes slots 42, pairs of positioning holes 44, and connectors 45. Rail member 37 of feeder 30 is inserted into slot 42. Two positioning pins 34 of feeder 30 are inserted into the two positioning holes 44 so as to position feeder 30 on feeder table 40. Connector 45 is provided between the two positioning holes 44, and is connected to connector 35 of feeder 30.

Feeder exchanging robot 50 is movable along X-axis rail 16 provided on the front surface of the multiple component mounting devices 20 and the front surface of feeder storage compartment 60 in parallel with the conveyance direction of the board (X-axis direction). Note that, in FIG. 2, X-axis rail 16 is not shown.

As shown in FIG. 4, feeder exchanging robot 50 includes robot moving mechanism 51, feeder transfer mechanism 53, encoder 57 (refer to FIG. 5), left and right monitoring sensors 58L and 58R (see FIG. 5), and robot control device 58 (see FIG. 5). Robot moving mechanism 51 moves feeder exchanging robot 50 along X-axis rail 16, and includes X-axis motor 52a (servo motor) for driving the driving belt, and guide roller 52b for guiding the movement of feeder exchanging robot along X-axis rail 16. Feeder transfer mechanism 53 transfers feeder 30 between component mounting device 20 and feeder storage compartment 60, and includes clamp section 54 for clamping feeder 30 and Y-axis slider 55 for moving clamp section 54 along Y-axis guide rail 55b. Y-axis slider 55 moves clamp section 54 in the front-rear direction (Y-axis direction) by driving Y-axis motor 55a. Encoder 57 detects the moving position of feeder exchanging robot 50 in the left-right direction (X-axis direction). Monitoring sensors 58L and 58R monitor the for presence of an interference item (operator), and are configured by, for example, an infrared sensor. Left monitoring sensor 58L is attached to the left side (opposite to the conveyance direction of board S) of feeder exchanging robot 50. Right monitoring sensor 58R is attached to the right side (the same side as the conveyance direction of board S) of feeder exchanging robot 50. Robot control device 58 is composed of a well-known CPU, ROM, RAM, and the like, receives detection signals from encoder 57 and monitoring sensors 58L and 58R, and outputs drive signals to robot moving mechanism 51 (X-axis motor 52a) and feeder transfer mechanism 53 (clamp section 54 and Y-axis motor 55a).

Robot control device 58, when attaching a feeder 30 in feeder exchanging robot 50 to component mounting device 20, first, moves feeder exchanging robot 50 to a position facing feeder table 40 of component mounting device 20 to which the feeder 30 is to be mounted by controlling X-axis motor 52a. Next, robot control device 58 causes clamp section 54 to clamp the feeder 30. Then, robot control device 58 controls Y-axis motor 55a to move Y-axis slider 55 rearwards (toward component mounting device 20), inserts rail member 37 of feeder 30 into slot 42 of feeder table 40 facing feeder exchanging robot 50, and causes Y-axis motor 54 to release the clamping of Y-axis slider 30. By this, feeder 30 is attached to feeder table 40 of component mounting device 20.

When a feeder 30 is removed from component mounting device 20 and collected into feeder exchanging robot 50, robot control device 58 first controls X-axis motor 52*a* to move feeder exchanging robot 50 to a position facing feeder table 40 of component mounting device 20 to which the feeder 30 to be collected is attached. Next, robot control device 58 clamps the feeder 30 attached to feeder table 40 opposite feeder exchanging robot 50 to clamp section 54. Then, robot control device 58 controls Y-axis motor 55*a* to move Y-axis slider 55 forwards (towards feeder exchanging robot 50). As a result, the feeder 30 is removed from feeder table 40 and collected in feeder exchanging robot 50.

Feeder storage compartment 60, in order to accommodate multiple feeders 30, has a similar configuration as feeder table 40 provided on component mounting device 20, with multiple feeders being arranged in the left-right direction (X axis direction). Feeder table 40 of feeder storage compartment 60 is provided at the same height (Z-axis position) as feeder table 40 of component mounting device 20. Therefore, feeder exchanging robot 50, at the position facing feeder storage compartment 60, can attach and detach feeder 30 to and from feeder table 40 of feeder storage compartment 60 using a similar operation as attaching and detaching feeder 30 to and from feeder table 40 of component mounting device 20.

Figure 6:
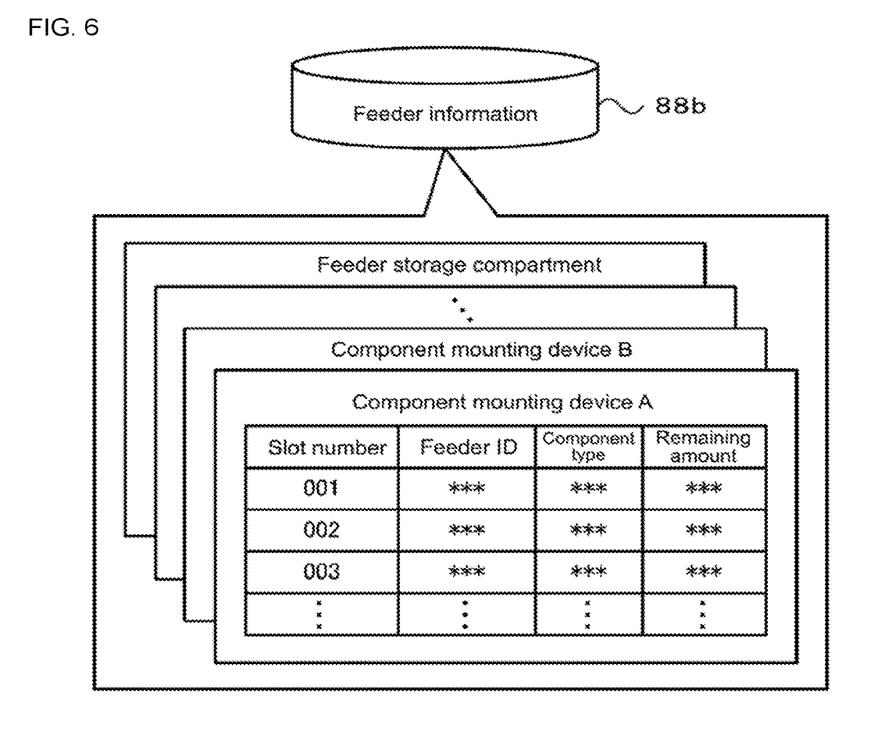
FIG. 6 illustrates an example of feeder information 88b.
Figure 7:
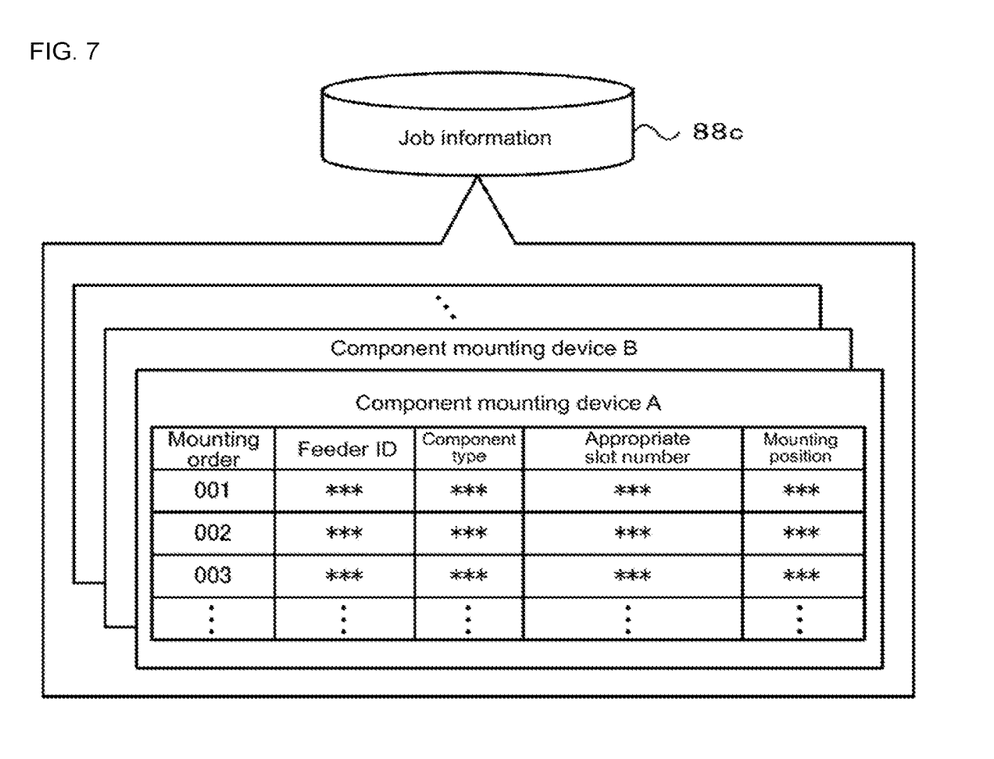
FIG. 7 illustrates an example of job information 88c.

Management device 80 is a general-purpose computer, and as shown in FIG. 5, includes management control device 82, input device 84 such as a keyboard or a mouse, display 86, and memory device 88. Management control device 82 includes a CPU, ROM, RAM, and the like, and is electrically connected to input device 84, display 86, and memory device 88. Memory device 88 is an HDD or an SSD, and stores production program 88*a*, feeder information 88*b*, job information 88*c*, status information 88*d*, and the like. Here, production program 88*a* is a program for determining, at the respective component mounters 10, which components are mounted on which board S and in which order, and how many boards S mounted in such a manner are produced. Feeder information 88*b* is information relating to feeders 30 held by component mounting devices 20 and feeder storage compartments 60. FIG. 6 illustrates an example of feeder information 88*b*. As shown, feeder information 88*b* includes the number (slot number) of feeder table 40 to which each feeder 30 is set, identification information (feeder ID) of feeder 30, the type of component (component type) held by each feeder 30, the remaining amount of components (component remaining amount), and the like. Job information 88*c* is information relating to mounting instructions to each component mounting device 20. FIG. 7 illustrates an example of job information 88*c*. As shown, job information 88*c* includes the mounting order and component types of the components to be mounted, the mounting positions of the components, the identification information (feeder ID) of the feeders 30 holding the components, the number (appropriate slot number) of feeder table 40 to which the feeder 30 is to be mounted, and the like. The appropriate slot number is an appropriate mounting position of each feeder 30 for each component mounting device 20 to efficiently pick up and mount a component. Status information 88*d* is information indicating the operation status of each component mounting device 20, and includes the statuses such as board being loaded, the board being unloaded, mounting operation (including pickup operation) being performed, error stoppage, and the like.

Management device 80 is connected to mounting control device 28 so as to be able to communicate, and exchanges various kinds of information with each component mounting device 20. Management device 80 receives the operation status from component mounting device 20 and updates the status information 88*d* to the latest information. Further, management device 80 is communicably connected to supply control device 38 of the feeder 30 set on feeder table 40 of component mounting device 20 via mounting control device 28. When a feeder 30 is removed from component mounting device 20 or a new feeder 30 is set to component mounting device 20, management device 80 receives the set/removal state from the corresponding component mounting device 20 and updates feeder holding information 88*b* to the latest information. Further, management device 80 is connected to the robot control device 58 so as to be able to communicate wirelessly, and exchanges various kinds of information with feeder exchanging robot 50. In addition, management device 80 is also communicably connected to the respective control devices of printing device 12, print inspection device 14, and the mounting inspection device, and exchanges various kinds of information with those devices. Management device 80 determines whether a setup change has occurred based on job information 88*c* stored in memory device 88 and the mounting status information received from mounting control device 28 of component mounting device 20, and when determining that a setup change has occurred, transmits a setup change instruction to robot control device 58. Further, when receiving error information from mounting control device 28, management device 80 outputs the fact that an error has occurred to display 84 to inform an operator, and transmits the fact to robot control device 58.

The management device 80 also manages feeder storage compartment 60.

Management device 80 is communicatively connected to supply control device 38 of the feeder 30 set on feeder table 40 of feeder storage compartment 60. Management device 80 updates feeder information 88*b* to the most current information when a feeder 30 is removed from feeder storage compartment 60 or a new feeder 30 is attached to feeder storage compartment 60.

Operation of component mounting system 10 thus configured will be described. First, operation of automatically exchanging feeder 30 using feeder exchanging robot 50 will be described. Robot control device 58 receives a setup change instruction (job information 88*c*) from management device 80, detaches feeders 30 containing components unnecessary for the next mounting operation from each component mounting device 20 and sets them in feeder storage compartment 60, and detaches feeders 30 containing components required for the next mounting operation from feeder storage compartment 60 and sets them on component mounting devices 20. Further, robot control device 58 receives out-of-part information (component remaining quantity is zero) of feeders 30 attached to each component mounting device 20 from each component mounting device 20 via management device 80, detaches those feeders 30 from component mounting device 20 and sets them in feeder storage compartment 60, and detaches feeders 30 containing the same type of component from feeder storage compartment 60 and sets them on component mounting devices 20.

In this manner, mounting of feeders 30 to the respective component mounting devices 20 is basically performed by feeder exchanging robot 50. Therefore, all the feeders 30 should be set at the correct positions (appropriate slot numbers) in accordance with job information 88*c*. However, for example, when an error occurs and a component mounting device 20 stops operating, the operator needs to perform a recovery operation to remove the cause of the error and restart operation of the component mounting device 20. Here, during the recovery work, an operator may detach the feeder 30 set on the component mounting device 20, and then reset the feeder 30 after the recovery work has been completed. In this case, if the feeder 30 is not set in the correct position, operation of component mounting device 20 cannot be restarted and operation efficiency is lowered.

Figure 8:
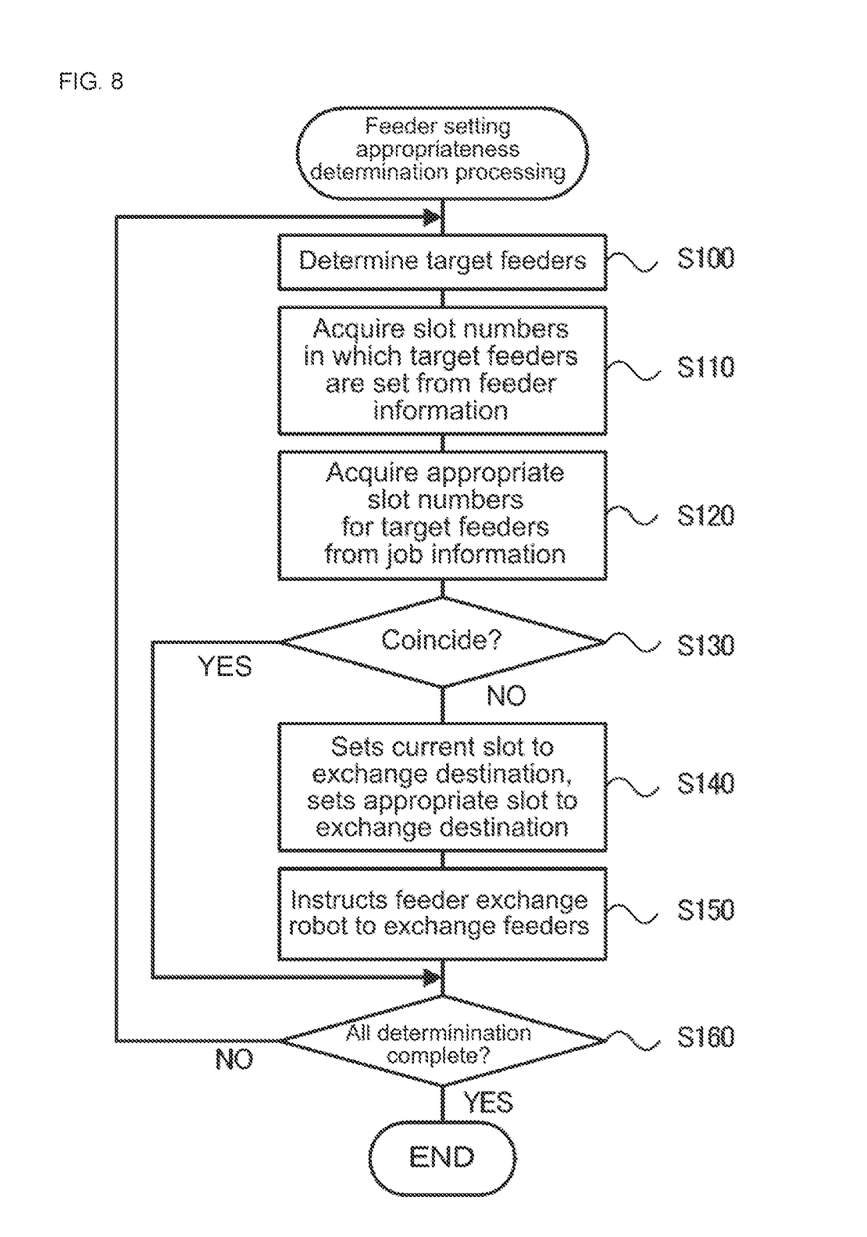
FIG. 8 is a flowchart showing an example of feeder setting appropriateness determination processing performed by management control device 82.

FIG. 8 is a flowchart showing an example of feeder setting appropriateness determination processing performed by management control device 82. Feeder setting appropriateness determination processing determines whether feeders 30 are set at correct positions (appropriate slot numbers) when feeders 30 are set on component mounting device 20 by the operator. Feeder setting appropriateness determination processing is performed when feeder information 88b is updated.

When feeder setting appropriateness determination processing is performed, management control device 82, first, determines target feeders (feeder IDs) that are targets for operation among all the feeders set on each component mounting device 20 (S100), and acquires the slot numbers (current slots numbers) in which the target feeders are set (S110). Next, management control device 82 acquires the correct slot number (appropriate slot number) of target feeders from job information 88c (S120). Next, management control device 82 determines whether the current slot number and the appropriate slot number of the target feeders coincide with each other (S130). If it is determined that the current slot number of a target feeder matches the appropriate slot number, management control device 82 proceeds to S160. On the other hand, if it is determined that the current slot number of the target feeder does not match the appropriate slot number, management control device 82 sets the current slot number to the exchange source slot number, sets the appropriate slot number to the exchange destination slot number (S140), specifies the set exchange source slot number and exchange destination slot number, and transmits an instruction signal for exchanging feeder 30 to robot control device 58 of feeder exchanging robot 50 (S150). Further, management control device 82 determines whether the determination of the setting appropriateness of all the feeders 30 has been completed (S160), and if it is determined that the determination has not been completed, it returns to the S100 to repeat the processing of S100 to S150, and if it is determined that the determination has been completed, it ends the feeder setting appropriateness determination processing.

Figure 9:
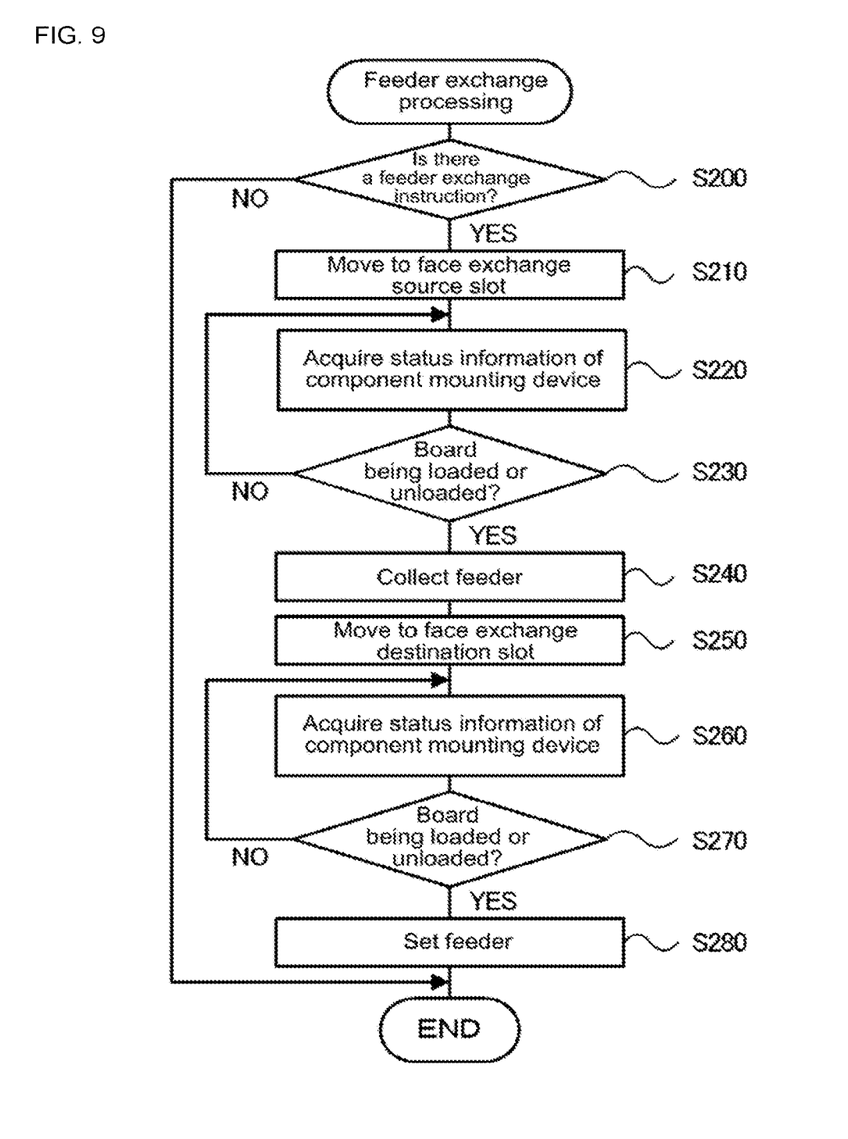
FIG. 9 is a flowchart showing an example of feeder exchange processing performed by robot control device 58.

FIG. 9 is a flowchart showing an example of feeder exchange processing performed by robot control device 58. Feeder exchange processing is repeated at predetermined intervals. When feeder exchange processing is performed, robot control device 58 first determines whether an instruction signal for feeder exchange has been received from management control device 82 (S200). If robot control device 58 determines that the instruction signal for feeder exchange has not been received, it ends feeder exchange processing as is. On the other hand, if robot control device 58 determines that the instruction signal for feeder exchange has been received, it controls robot moving mechanism 51 (X-axis motor 52a) such that feeder exchanging robot 50 moves to a position facing the exchange source slot number of feeder table 40 of (S210). Continuing, robot control device 58 acquires status information of the corresponding component mounting device 20 (the component mounting device 20 of the feeder table 40 with the exchange source slot number) (S220), and determines whether the corresponding component mounting device 20 is loading or unloading a board (S230). If robot control device 58 determines that the corresponding component mounting device 20 is not loading or unloading a board, it returns to S220. On the other hand, if robot control device 58 determines that the corresponding component mounting device 20 is loading or unloading a board, it controls feeder transfer mechanism 53 to collect the feeder 30 set in the exchange source slot number of feeder table 40 (S240).

Next, robot control device 58 controls robot moving mechanism 51 (X-axis motor 52a) such that feeder exchanging robot 50 moves to a position facing the exchange destination slot number of feeder table 40 of (S250). Continuing, robot control device 58 acquires status information of the corresponding component mounting device 20 (the component mounting device 20 of the feeder table 40 with the exchange destination slot number) (S260), and determines whether the corresponding component mounting device 20 is loading or unloading a board (S270). If robot control device 58 determines that the corresponding component mounting device 20 is not loading or unloading a board, it returns to S260. On the other hand, if robot control device 58 determines that the corresponding component mounting device 20 is loading or unloading a board, it controls feeder transfer mechanism 53 to set the feeder 30 in the exchange destination slot number of feeder table 40 (S280), then ends feeder exchange processing. Here, when another feeder 30 is set on the feeder table 40 with the exchange destination slot number, robot control device 58 collects another feeder 30 in the free area of feeder exchanging robot 50, and then sets the feeder 30 to be originally set on feeder table 40 with the exchange destination slot number. If another feeder 30 is set in the exchange destination slot number of feeder table 40, it is determined in the above-described feeder setting appropriateness determination processing that another feeder 30 is not set on the correct feeder table 40. Therefore, robot control device 58 moves feeder exchanging robot 50 to a position facing the correct feeder table 40 of another feeder 30, and also performs an operation of setting the collected another feeder 30 on the correct feeder table 40.

Correspondences between main constituent elements of embodiments and main constituent elements of the disclosure will be clarified here. That is, feeder 30 corresponds to a feeder, feeder table 40 corresponds to a feeder holding portion, component mounting device 20 corresponds to a component mounting device, and feeder exchanging robot 50 corresponds to a feeder exchanging device.

Component mounting system 10 according to an embodiment described above acquires the type (feeder ID) and the arrangement (slot number) of feeders 30 set on each of the multiple component mounting devices 20, determines whether each feeder 30 is set at a predetermined position (appropriate slot number), and upon determining that there is a feeder 30 that is not set at the appropriate position, uses feeder exchanging robot 50 to reset the feeder 30 that is not set at the appropriate position to the appropriate position for that feeder. This allows component mounting system 10 to automatically reset feeders 30 to the appropriate position even if the operator set a feeder 30 in the wrong position or intentionally sets the feeder 30 at any suitable position. As a result, component mounting system 10 can avoid failure to continuously perform mounting operation and a deterioration of mounting efficiency.

Further, when it is determined that there is a feeder 30 which is not set at an appropriate position, component mounting system 10 according to the embodiment uses feeder exchanging robot 50 to reset the feeder 30 which is not set at the appropriate position to the appropriate position while the corresponding component mounting device 20 is loading or unloading a board. Component mounting device 20 stops operation of head 24 (head moving mechanism 25) during board loading and board unloading. Therefore, component mounting system 10 does not perform exchange of feeder 30 while head 24 (head moving mechanism 25) of the corresponding component mounting device 20 is operating, thereby preventing errors such as component pickup errors due to the overlapping of mounting operation (pickup operation) and exchange operation of feeder 30.

Meanwhile, it goes without saying that the present disclosure is not limited to the above-mentioned embodiments and various embodiments may be applied within the technical scope of the disclosure.

Figure 10:
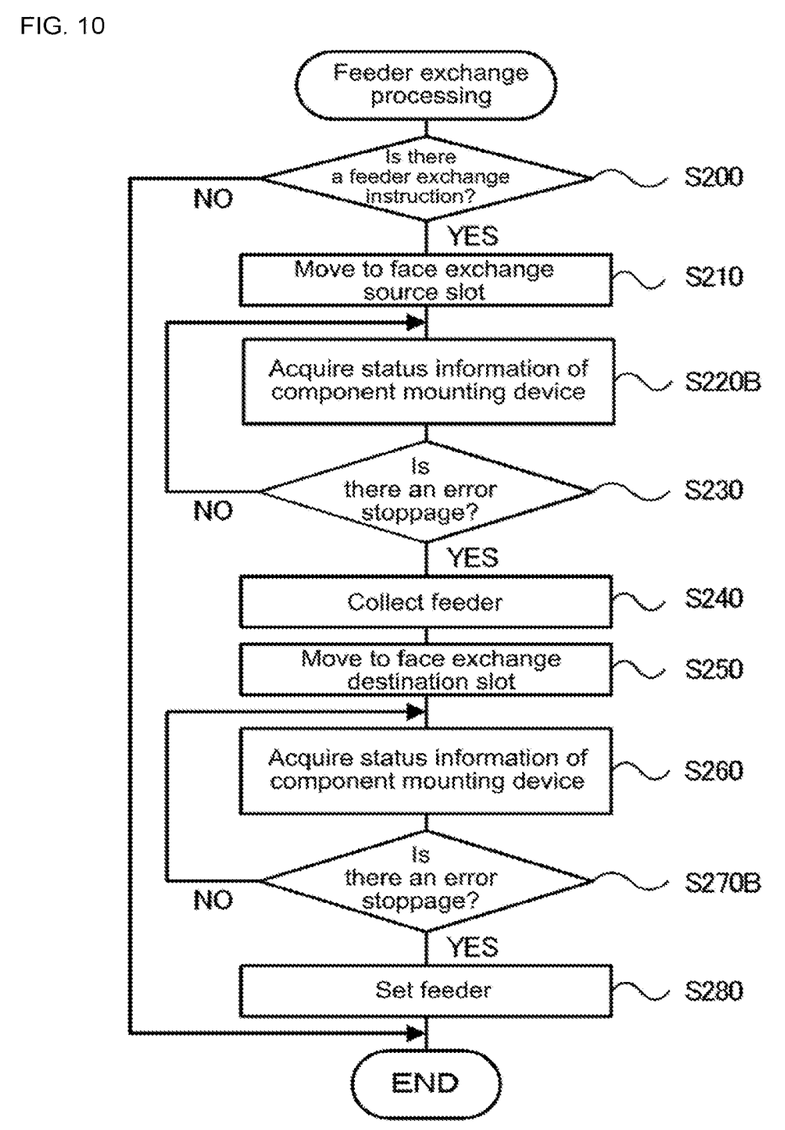
FIG. 10 is a flowchart showing an alternative example of feeder exchange processing.

For example, in an embodiment described above, robot control device 58 collects feeder 30 from the exchange source slot number of feeder table 40 or sets feeder 30 to the exchange destination slot number of feeder table 40 while the corresponding component mounting device 20 is loading or unloading a board. However, robot control device 58 may collect feeder 30 from the exchange source slot number of feeder table 40 or set feeder 40 to the exchange destination slot number of feeder table 40 while the corresponding component mounting device 20 is stopped due to an error. FIG. 10 is a flowchart showing an alternative example of feeder exchange processing. Feeder exchange processing of the alternative example of FIG. 10 differs from the feeder exchange processing of FIG. 9 in that instead of S230 and S270, processing is performed to determine whether there is an error stoppage (S230B, S270B). By this, component mounting system 10 does not perform exchange of feeder 30 while head 24 (head moving mechanism 25) of the corresponding component mounting device 20 is operating, thereby preventing errors such as component pickup errors due to the overlapping of mounting operation (pickup operation) and exchange operation of feeder 30. Note that, in this alternative example, robot control device 58 may collect feeder 30 from the exchange source slot number of feeder table 40 when either of S230 or S230B is performed, and may set feeder 40 on the exchange destination slot number of feeder table 40 when either of S270 or S270B is performed.

Figure 11:
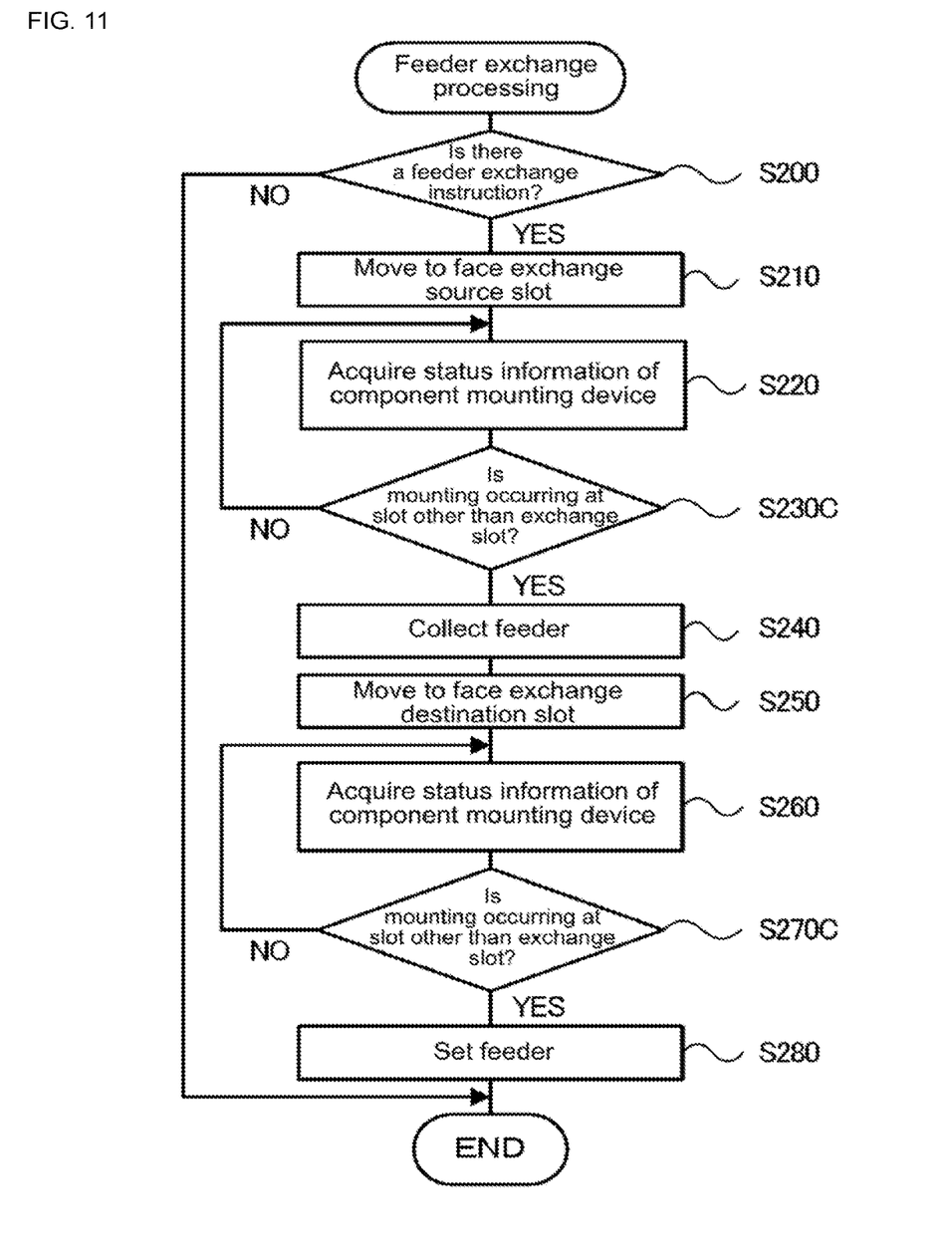
FIG. 11 is a flowchart showing an alternative example of feeder exchange processing.
Figure 12:
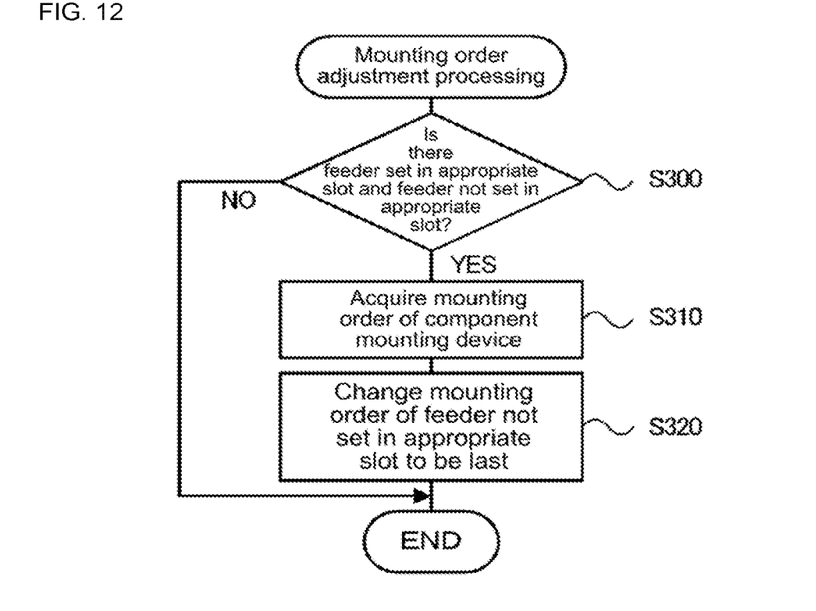
FIG. 12 is a flowchart showing an example of mounting order adjustment processing performed by management control device 82.

Further, robot control device 58 may collect feeder 30 from the exchange source slot number of feeder table 40 or set feeder 40 to the exchange destination slot number of feeder table 40 while mounting operation (pickup operation) is being performed at a feeder 30 set on a feeder table 40 other than the feeder tables 40 with the exchange source slot number and the exchange destination slot number that are at the same component mounting device 20. FIG. 11 is a flowchart showing an alternative example of feeder exchange processing. Feeder exchange processing of FIG. 11 differs from the feeder exchange processing of FIG. 9 in that, instead of S230, it is determined whether mounting operation (including pickup operation) is being performed at a feeder table 40 other than the feeder table 40 with the exchange source slot number (S230C), and instead of S270, it is determined whether mounting operation (including pickup operation) is being performed at a feeder table 40 other than the feeder table 40 with the exchange destination slot number (S270C). As a result, component mounting system 10 can prevent a feeder 30 being used for mounting operation (pickup operation) from being replaced, thereby avoiding errors such as component pickup errors due to the overlapping of pickup operation and exchanging of the feeder 30. Note that, in this alternative example, robot control device 58 may collect feeder 30 from the exchange source slot number of feeder table 40 when any of S230, S230B, or S230C is performed, and may set feeder 40 on the exchange destination slot number of feeder table 40 when any of S270, S270B, or S270C is performed. Further, in this case, management control device 82 may change the mounting order of the corresponding component mounting device 20. FIG. 12 is a flowchart showing an example of mounting order adjustment processing performed by management control device 82. In the mounting order adjustment processing, management control device 82 determines whether there are feeders 30 set in the appropriate slot numbers on feeder table 40 and feeders 30 not set in the appropriate slot numbers on feeder table 40 in the respective component mounting devices 20 (S300). Upon determining that all feeders 30 are set in the appropriate slot numbers on feeder table 40, or that all feeders 30 are not set in the appropriate slot numbers on feeder table 40, management control device 82 ends mounting order adjustment processing as is. On the other hand, upon determining that, at any of the component mounting devices 20, there is a feeder 30 set in the appropriate slot number on feeder table 40 and a feeder 30 not set in the appropriate slot number on feeder table 40, management control device 82 acquires the mounting order of the corresponding component mounting device 20 from job information 88c (S310). Then, management control device 82 changes the mounting order of the feeder 30 not set in the appropriate slot number of feeder table 40 (S320) to be last, and ends mounting order adjustment processing. As a result, component mounting device 20 preferentially picks up component from a feeder 30 set in the appropriate slot number on feeder table 40 and mounts the component on the board S. Further, feeder exchanging robot 50 resets the feeder 30 in the appropriate slot number on feeder table 40 while component mounting device 20 preferentially performs the mounting operation (pickup operation) from the feeder 30 set in the appropriate slot number on feeder table 40.

In an embodiment described above, feeder setting appropriateness determination processing is performed by management control device 82. However, component mounting device 20 may perform feeder setting appropriateness determination processing, or feeder exchanging robot 50 may perform feeder setting appropriateness determination processing. Note that, if each component mounting device 20 performs feeder setting appropriateness determination processing, robot control device 58 may be configured to be able to directly communicate with mounting control device 28 of each component mounting device 20 without using management device 80.

INDUSTRIAL APPLICABILITY

The present disclosure is applicable to component mounting system manufacturing industries and the like.

REFERENCE SIGNS LIST

10: component mounting system;
12: printing device;
14: print inspection device;
16: X-axis rail;
20: component mounting device;
23: board conveyance device;
24: head;
25: head moving device;
26: mark camera;
27: component camera;
29: control device;
30: feeder;

32: tape reel;
33: tape feeding mechanism;
34: positioning pin;
35: connector;
37: rail member;
39: feeder control device;
40: feeder table;
42: slot;
44: positioning hole;
45: connector;
50: feeder exchanging robot;
51: robot moving mechanism;
52a: X-axis motor;
52b: guide roller;
53: feeder transfer mechanism;
54: clamp section;
55a: Y-axis motor;
55b: Y-axis guide rail;
57: encoder;
58L, 58R: monitoring sensor;
59: robot control device;
60: feeder storage compartment;
80: management device;
82: management control section;
84: input device;
86: display;
88: memory section;
88a: production program;
88b: feeder information;
88c: job information;
88d: status Information;
S: board

The invention claimed is:

1. A component mounting system comprising:
multiple component mounting devices configured to collect components from feeders set at multiple feeder holding sections and mount the components on a board, the multiple feeder holding sections being provided on each of the multiple component mounting devices and configured to removably hold the feeders;
a feeder exchanging robot configured to move along a line along which the multiple component mounting devices are arranged and exchange feeders with respect to each of the component mounting devices; and
a management device including circuitry configured to receive information from the multiple component mounting devices and send setup change instructions to the feeder exchanging robot, wherein
the management device is configured to
determine target feeders that are targets for operation among all the feeders set on each of the multiple component mounting devices,
acquire a current slot number in which the target feeders are set,
acquire a correct slot number of the target feeders from job information stored in memory of the management device,
determine whether each of the feeders is set at a predetermined appropriate position when the current slot number matches the appropriate slot number, and
upon determining that there is a feeder that is not set at the appropriate position, set the current slot number of the feeder that is not set at the appropriate position to an exchange source slot number, set the appropriate slot number to an exchange destination slot number, and control the feeder exchanging robot to reset the feeder that is not set at the appropriate position to the appropriate position for that feeder based on the exchange source slot number and the exchange destination slot number.

2. The component mounting system according to claim 1, wherein
when the management device determines that there is a feeder that is not set at the appropriate position, the management device is configured to control the feeder exchange robot to reset the feeder that is not set at the appropriate position to the appropriate position for that feeder while mounting operation is not occurring at the component mounting device for that feeder.

3. The component mounting device according to claim 1, wherein
when the management device determines that there is a feeder that is not set at the appropriate position, the management device is configured to control the feeder exchange robot to reset the feeder that is not set at the appropriate position to the appropriate position for that feeder while a board is being loaded into the component mounting device for that feeder or while a board is being unloaded from the component mounting device for that feeder.

4. The component mounting system according to claim 1, wherein
when the management device determines that, with respect to one of the component mounting devices, there is a feeder that is set at the appropriate position and a feeder that is not set at the appropriate position, the management device is configured to control the feeder exchanging robot to reset the feeder that is not set at the appropriate position to the appropriate position for that feeder while mounting operation is being performed by collecting components from the feeder that is set at the appropriate position.

5. The component mom ting system according to claim 4, wherein
the management device is further configured to adjust a mounting order such that mounting operation is performed by collecting components with priority from feeders set at the appropriate position.

6. The component mounting system according to claim 1, wherein
the feeder exchanging robot includes a feeder transfer mechanism including a clamp section which clamps the feeder and a slider which moves the clamp section along a guide rail.

* * * * *